(12) United States Patent
Ariyoshi et al.

(10) Patent No.: US 11,616,384 B2
(45) Date of Patent: Mar. 28, 2023

(54) BATTERY CHARGER WITH CONSTANT CURRENT CONTROL LOOP

(71) Applicant: Dialog Semiconductor (UK) Limited, London (GB)

(72) Inventors: Katsuhiko Ariyoshi, Yokohama (JP); Yuri Sugihara, Itabashi-ku (JP); Soichiro Ohyama, Yokohama (JP); Hidechika Yokoyama, Setagaya-ku (JP)

(73) Assignee: Dialog Semiconductor (UK) Limited, London (GB)

( * ) Notice: Subject to any disclaimer, the term of this patent is extended or adjusted under 35 U.S.C. 154(b) by 910 days.

(21) Appl. No.: 16/357,714

(22) Filed: Mar. 19, 2019

(65) Prior Publication Data

US 2020/0303928 A1 Sep. 24, 2020

(51) Int. Cl.
*H02J 7/00* (2006.01)
*H03K 5/24* (2006.01)

(52) U.S. Cl.
CPC ....... *H02J 7/00714* (2020.01); *H02J 2207/20* (2020.01); *H03K 5/24* (2013.01)

(58) Field of Classification Search
CPC .................................................. H02J 7/00714
USPC ......................................................... 320/163
See application file for complete search history.

(56) References Cited

U.S. PATENT DOCUMENTS

| | | |
|---|---|---|
| 4,536,696 A | 8/1985 | Ray |
| 5,617,007 A | 4/1997 | Keidl et al. |
| 6,288,522 B1 | 9/2001 | Odaohhara et al. |
| 6,459,239 B1 | 10/2002 | Price |
| 8,179,139 B2 * | 5/2012 | Kawasumi ............ H01M 10/42 324/430 |
| 10,141,764 B2 | 11/2018 | Gerna |
| 2013/0221905 A1 * | 8/2013 | Holloway ................ H02J 7/342 320/107 |
| 2015/0102779 A1 * | 4/2015 | Schumacher ........... H02J 7/007 320/141 |
| 2017/0126026 A1 * | 5/2017 | Gerna ........................ H02J 7/00 |
| 2019/0379230 A1 * | 12/2019 | Wu ........................... H02J 7/06 |

FOREIGN PATENT DOCUMENTS

| | | |
|---|---|---|
| DE | 10 2015 221 101 | 5/2017 |
| JP | 2001-186684 | 7/2001 |
| JP | 2012-105467 | 5/2012 |

OTHER PUBLICATIONS

German Office Action, File No. 10 2019 210 016.3, Applicant: Dialog Semiconductor (UK) Limited., dated Apr. 2, 2020, 6 pages.

* cited by examiner

*Primary Examiner* — Jerry D Robbins
(74) *Attorney, Agent, or Firm* — Saile Ackerman LLC; Stephen B. Ackerman

(57) ABSTRACT

It is an object of one or more embodiments of the present disclosure to provide a battery charger with a constant current control loop, for use in linear and switching chargers. Advantages include digital controls and a comparator, for decreasing charging current towards termination. The technique of the disclosure eliminates a constant voltage loop and amplifier, without increasing charging time. The technique also simplifies porting the design to another process technology node, and reduces size.

26 Claims, 17 Drawing Sheets

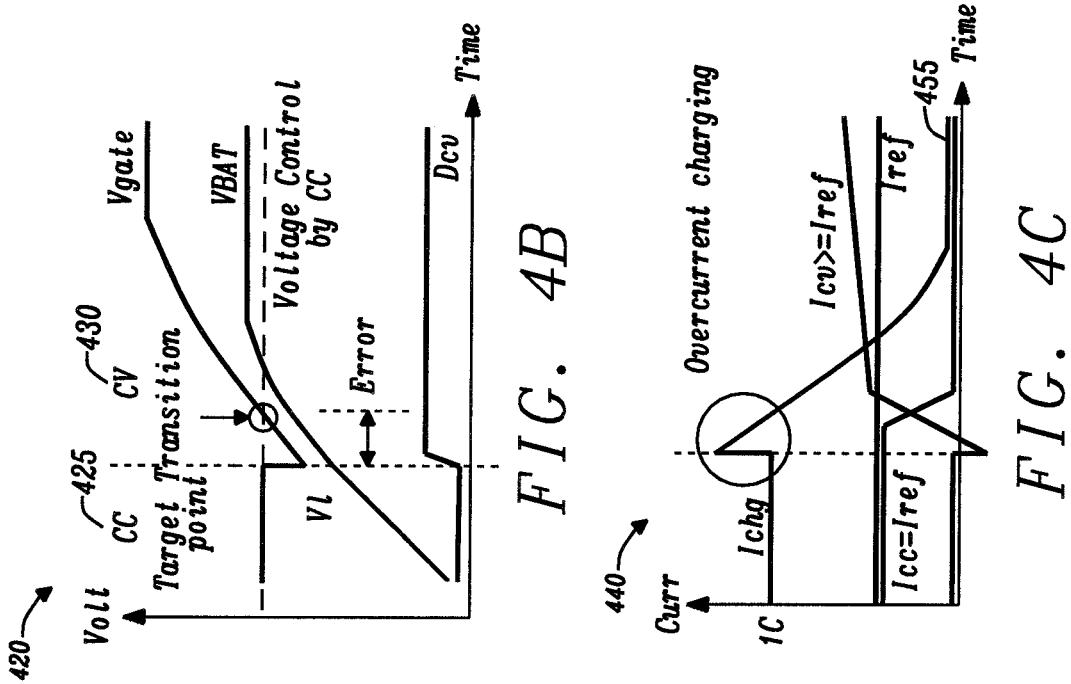
*FIG. 4B*
*FIG. 4C*
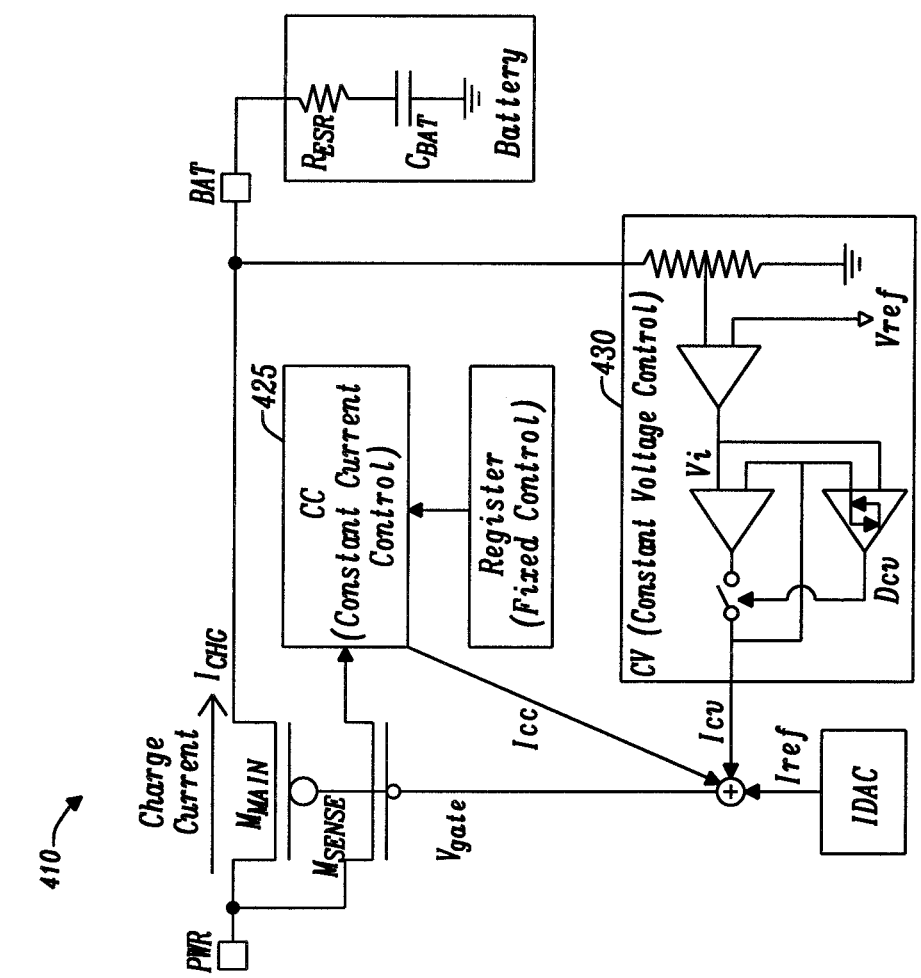
*FIG. 4A*

| Architecture | Conditions | Charge time [s] | Delta [s] |
|---|---|---|---|
| CC-CV | $C_{BAT} = 200F, R_{ESR} = 3ohms$<br>Charge Start: $V_{CELL} = 3.70V$<br>Charge End: $I_{CHG} = 5mA$<br>Current Setting is;<br>5mA and 70mA ~ 10mA in 10mA step | 2.415k | — |
| CC-DVL @ α=0.9<br>(The disclosure) | | 2.132k | −283 |

FIG. 17A

| Architecture | Conditions | Charge time [s] | Delta [s] |
|---|---|---|---|
| CC-CV | $C_{BAT} = 200F, R_{ESR} = 6ohms$<br>Charge Start: $V_{CELL} = 3.70V$<br>Charge End: $I_{CHG} = 5mA$<br>Current Setting is;<br>5mA and 70mA ~ 10mA in 10mA step | 3.399k | — |
| CC-DVL @ α=0.9<br>(The disclosure) | | 2.835k | −564 |

FIG. 17B

BATTERY CHARGER WITH CONSTANT CURRENT CONTROL LOOP

BACKGROUND

Field

The present disclosure relates generally to battery chargers, and more specifically to battery chargers with a constant current control loop.

Background

Conventional battery chargers use a constant current—constant voltage (CC-CV) control loop charging profile, as shown in FIG. 1, with the structure of FIG. 2. Note that a smaller battery pack has disadvantages, including unexpected increasing charge time, and a sensitive transition from CC to CV.

FIG. 1, 100, shows when the voltage of a battery pack, $V_{BAT}$ 115, is below a threshold voltage $V_{CV}$ to enter CV from CC, the charger regulates charging current $I_{CHG}$ 120. During CC charging, equivalent capacitance $C_{BAT}$ in battery cell 125 is charged, and $I_{CHG}$ increases $V_{BAT}$ at a constant rate. For $V_{BAT}$ below the threshold voltage $V_{CC}$ to enter CC from pre-charging, $I_{CHG}$ will be at a 0.1 C charging rate. For $V_{BAT}$ above $V_{CC}$ (and below $V_{CV}$), $I_{CHG}$ will be at a 1 C charging rate. The value C varies according to the battery capacity, and is defined by the equation C [A]=(battery capacity) [Ah]/1 [h]. Pre-charging, a part of CC charging, is when the battery requires a smaller charge current, and $V_{BAT}<V_{CC}$ in 110.

After $V_{BAT}$ reaches $V_{CV}$, $V_{BAT}$ is regulated at $V_{CV}$. During CV charging, $I_{CHG}$ decays exponentially due to the equivalent series resistance $R_{ESR}$ in battery cell 125, and the equivalent capacitance $C_{BAT}$. After $I_{CHG}$ is reduced to its target, the charging cycle is terminated.

FIG. 2, 200, shows a CC-CV charger. The charger has CC and CV control circuits, and each circuit functions apart from each other. The CC control circuit controls the gate voltage $V_G$ of the power device gate ($M_{MAN}$), to regulate $I_{CHG}$, by monitoring the mirrored current of $I_{CHG}$, using the Charging Current Detector, passing through the sense device ($M_{SENSE}$). The circuit is enabled when $V_{BAT}$ sensed by the voltage detector is below $V_{CV}$. The Voltage Detector measures $V_{BAT}$.

When $V_{BAT}$ gets close to $V_{CV}$, the CV control circuit is enabled, to take control over $V_G$, and the CC control circuit is disabled. During CV charging, $V_G$ is controlled to source appropriate $I_{CHG}$ to the battery, to reduce the gap between $V_{CV}$ and $V_{BAT}$. As a result, $V_{BAT}$ is regulated. Regardless of CC and CV charging, $V_G$ (and $I_{CHG}$ indirectly) works as the controlled input to the feedback system.

FIGS. 3A (3 ohm) and 3B (6 ohm) are graphical representations showing how a larger $R_{ESR}$ increases the CV region, and the resulting charge time, as $V_{BAT}$ voltage (315, 335) is shifted by $R_{ESR} \times I_{CHG}$ (320, 340). Note, that for the case of increasing charge time, $R_{ESR}$ 330 of a smaller battery is larger than $R_{ESR}$ 310 of a larger battery, and that an aged battery will increase $R_{ESR}$ as well. $V_{CELL}$ (325, 345) represents the voltage of the battery cell across $R_{ESR}$.

For the case of transition from CC to CV, a smaller battery requires a smaller current than a larger battery requires. This results in increased difficulty to enter CV from CC. The difficulty of the circuit in FIG. 2 comes from $V_G$ being controlled for both CC and CV charging, and from an architecture where the CC and the CV circuits work independently, which is apparent during the transition from CC to CV.

FIGS. 4A, 4B, and 4C are a circuit diagram and voltage/current charts showing a discontinuity in the battery charge current at the transition from CC to CV charging in 420, due to the use of independent CC 425 and CV 43 control circuits in 410. The CV control circuit may source overcurrent 455 ($I_{CHG}>1$ C) as shown in 440, where $I_{CHG}$ exceeds CC charge current 1 C, at the beginning of CV charging. During the period when $I_{CHG}>1$ C, the battery is overcharged (i.e. $V_{CELL}$ exceeds $V_{CV}$), and may be damaged.

FIG. 5, 500, shows another charging profile that uses the CC-CV structure of FIG. 2. Here, there the transition state called PRE-CV relaxes the transition from CC to CV of FIG. 4B, since the transition point is moved to a smaller charge current point than the 1 C value. PRE-CV is a part of CC, where the charger digitally changes the CC setting to be smaller before entering CV, and reduces the risk for overcharging (>1 C) at the transition point between CC and CV. The voltage of the battery pack is $V_{BAT}$ 515, the threshold voltage to enter CV from CC is $V_{CV}$, and the charging current $I_{CHG}$ is 520.

FIGS. 7A and 7B are current/voltage diagrams during CC step down, the battery charger digitally changes the CC setting to be smaller than the charge termination current, and introduces another disadvantage. CC step down 715 needs ΔT to be the same charge amount 730 as normal CV settling 725, for an area-A, in 710. Accordingly, it still needs the CV state to secure the increasing charge time of the CV region, especially when the system requires smaller termination current 720 (<0.1 C), in 740.

In FIGS. 7A and 7B, the charged amount for CV settling is:

$$\int I_{CHG}(t)dt = -\frac{\tau \cdot V_{BAT}}{R_{ESR}}\left[e^{-\frac{t}{\tau}}\right]_{T_0}^{T_1} \quad (1)$$

And the charged amount for PRE-CV settling is:

$$\int I_{CHG}(T_1)dt = \left[\frac{V_{BAT}}{R_{ESR}}e^{-\frac{T_1}{\tau}} \cdot t\right]_{T_0}^{T_2} \quad (2)$$

where (1)=(2)     (3)

and $T_0=k_0\tau$, $T_1=k_1\tau$, $\tau=R_{ESR} \cdot C_{BAT}$.     (4)

Substituting (4) into (3)

$\Delta T=\tau\{e^{k_1-k_0}-(1+k_1-k_0)\}$     (5)

where a larger k value means deep charging.
For example, at Time 1:
$C_{BAT}$=6 kF, RESR=0.1 ohm, and PRE-CV charging is from 1.00 A to 0.90 A:

$\Delta T=\tau\{e^{k_1-k_0}-(1+k_1-k_0)\}$=1.73 [sec]

For example, at Time 2:
$C_{BAT}$=6 kF, RESR=0.1 ohm, and PRE-CV charging is from 0.10 A to 0.05 A:

$\Delta T=\tau\{e^{k_1-k_0}-(1+k_1-k_0)\}$=92.06 [sec]

SUMMARY

Accordingly, it is an object of one or more embodiments of the present disclosure to provide a battery charger with a constant current control loop and no constant voltage control loop, for use in linear and switching chargers.

It is a further object of one or more embodiments of the disclosure to include digital controls and a comparator in a battery charger, for decreasing charging current towards termination.

Still further, it is an object of one or more embodiments of the disclosure to eliminate a constant voltage loop and amplifier, without increasing charging time, in a battery charger.

Still further, it is an object of one or more embodiments of the disclosure to simplify porting a battery charger design to other process technology nodes, and reducing size of the charger circuit.

Other objects will appear hereinafter.

The above and other objects of the present disclosure may be accomplished in the following manner. A battery charger is disclosed, comprising a constant current control loop, configured to provide a charge current to a battery, a digital voltage limiter, configured to sense a battery voltage, and dynamic controls, configured to calculate a dynamic control signal for controlling the charge current.

The above and other objects of the present disclosure may be further accomplished with a method for constant current control in a battery charger. The steps include providing a battery charger with a constant current (CC) control loop. The steps also include sensing a battery voltage and digitizing the battery voltage. The steps also include calculating a dynamic control signal for controlling a charge current.

In various embodiments the function may be used for short circuit detection, pre-charge voltage detection, or re-charge voltage detection.

In various embodiments a fixed control voltage is configured with a programmable digitized gain.

In various embodiments a Buck switching converter may be configured with a dynamic control voltage from the digital voltage limiter.

BRIEF DESCRIPTION OF THE DRAWINGS

The present disclosure will be more clearly understood from the following description taken in conjunction with the accompanying drawings in which like reference numerals designate similar or corresponding elements, regions and portions and in which:

FIGS. 4A, 4B, and 4C are a circuit diagram and voltage/current charts showing a discontinuity in the battery charge current at the transition from CC to CV charging, due to the use of independent CC and CV control circuits.

FIGS. 17A and 17B illustrates simulation results for the architecture of the prior art compared to that of the present disclosure, when the equivalent series resistance varies.

DETAILED DESCRIPTION

The present disclosure proposes a new battery charger architecture, providing a constant current (CC) control loop, for use in linear chargers and switching battery chargers. Advantages include the use of digital controls and a comparator, for decreasing charging current towards termination. The technique of the disclosure eliminates a constant voltage loop and amplifier, without increasing charging time.

The CC control loop of the present disclosure achieves a faster, more consistent charging time than conventional CC-CV chargers. Removal of the constant voltage (CV) control loop reduces circuit area and simplifies design time. In addition, there is less sensitivity to variation of external parameters ($R_{ESR}$, $C_{BAT}$, etc), and disadvantages of the conventional CC-CV charging structure are addressed.

Figure 6:
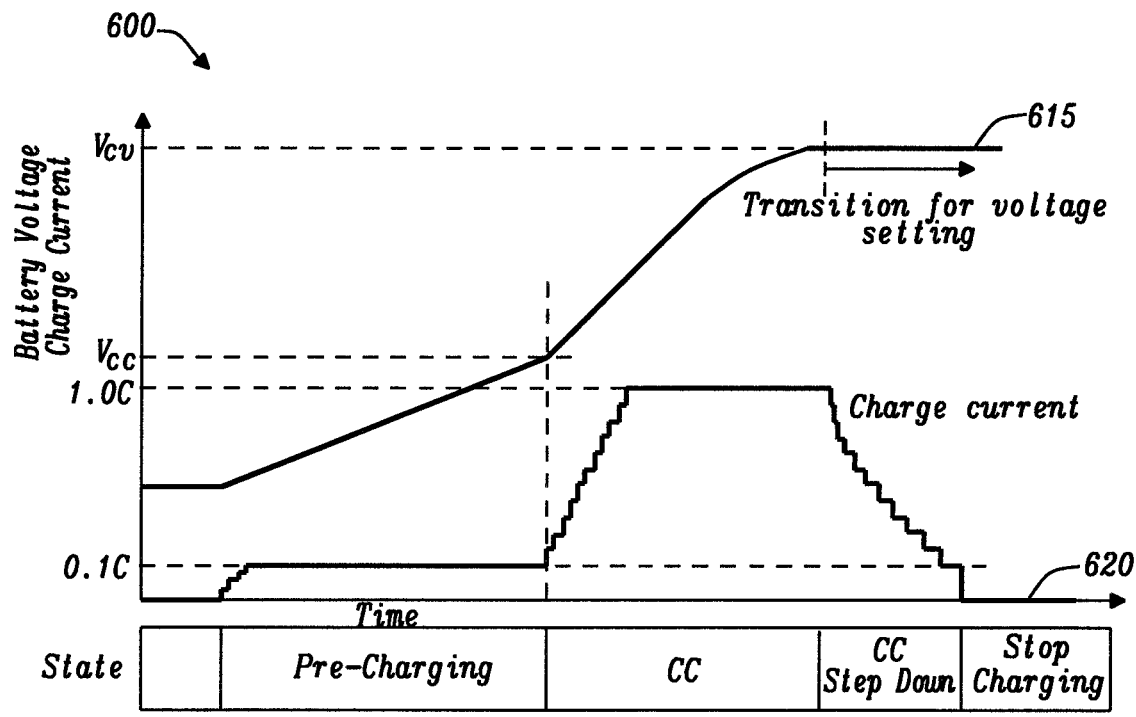
FIG. 6 includes voltage/current curves demonstrating the present disclosure without a constant voltage (CV) control loop, and a battery charging profile.

FIG. 6, 600, includes voltage/current curves demonstrating how the present disclosure without a constant voltage (CV) control loop, and a battery charging profile. Now (PRE-CV+CV) are replaced by a constant current (CC) control loop step down, where the charger digitally changes the CC setting to be smaller than the charge termination current. The voltage of the battery pack is $V_{BAT}$ 615, the transition for the voltage settling is CC step down, and the charging current $I_{CHG}$ is 620. The state of the battery moves from pre-charging, to a CC phase, then to CC-CC step down, and to stop charging, as the charge current rises to 1 C and then below its target value 0.1 C.

Figure 8C:
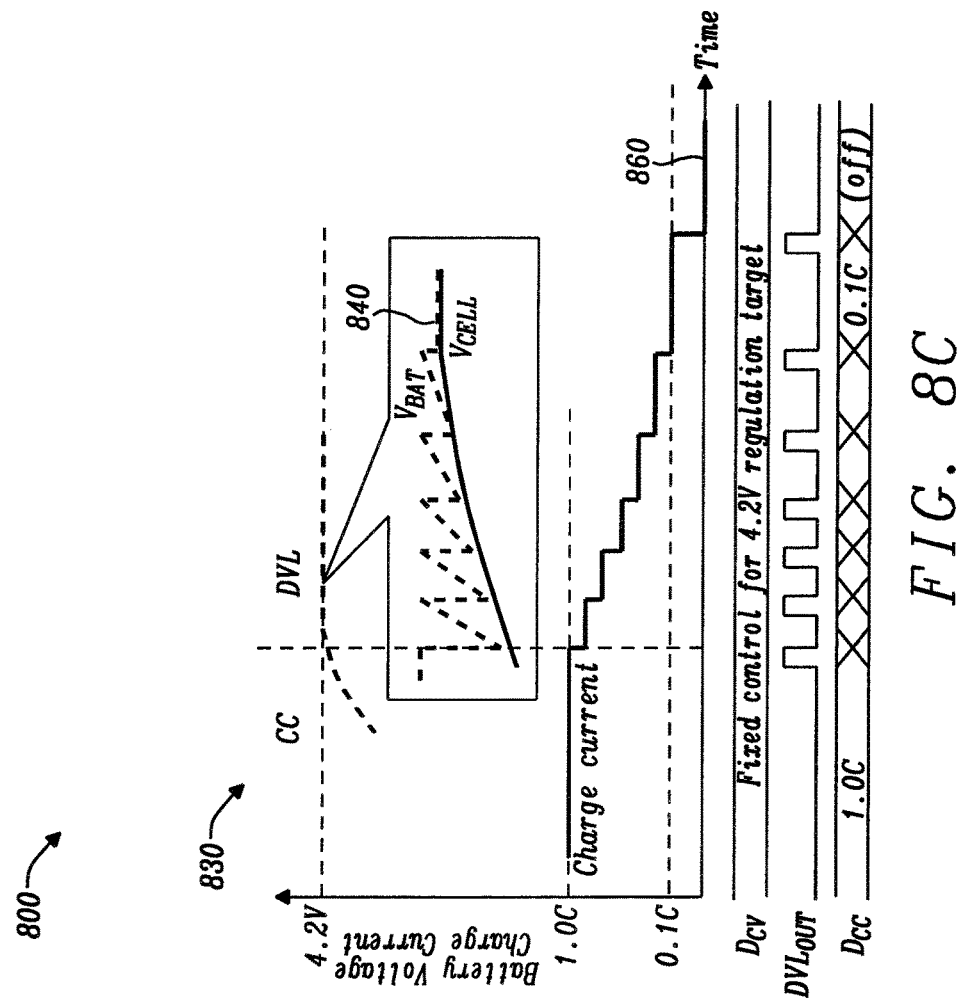
FIGS. 8A, 8B, and 8C are circuit diagrams and a voltage/current chart showing the proposed Digital Voltage Limiter (DVL) of the disclosure replacing the constant voltage (CV) control loop of the prior art.
Figure 8A:
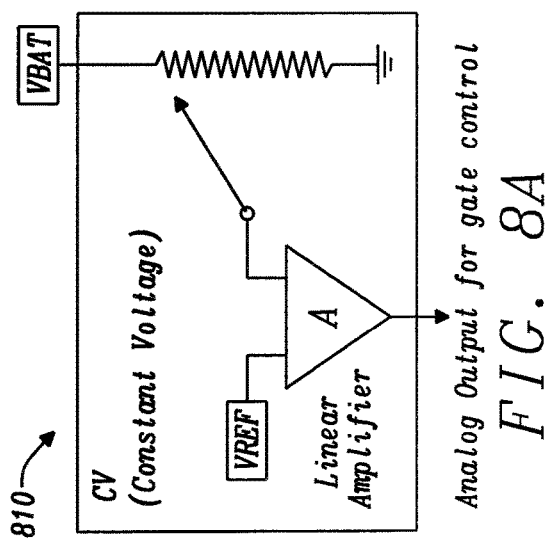
Figure 8B:
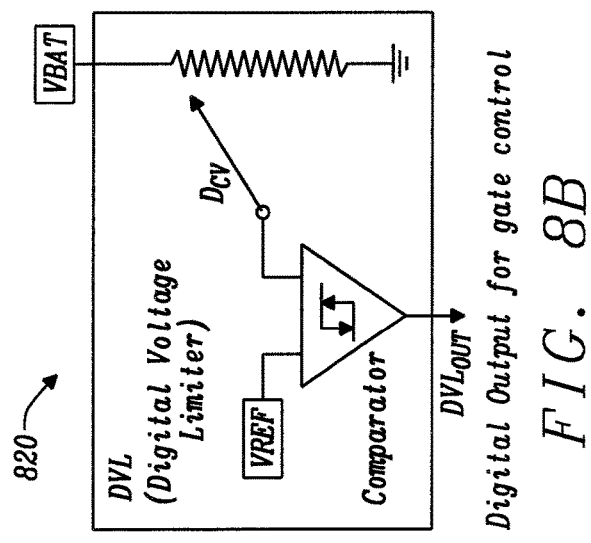
Figure 9A:
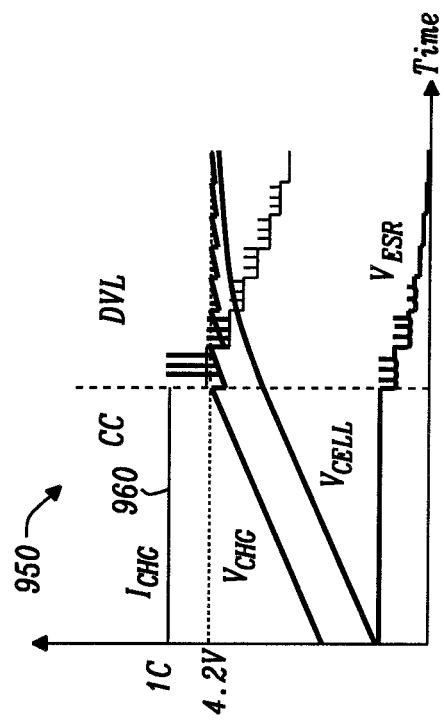
FIGS. 9A and 9B illustrate an Accelerated Settle Down (ASD) technique to achieve the constant current control loop for the charger.
Figure 9B:
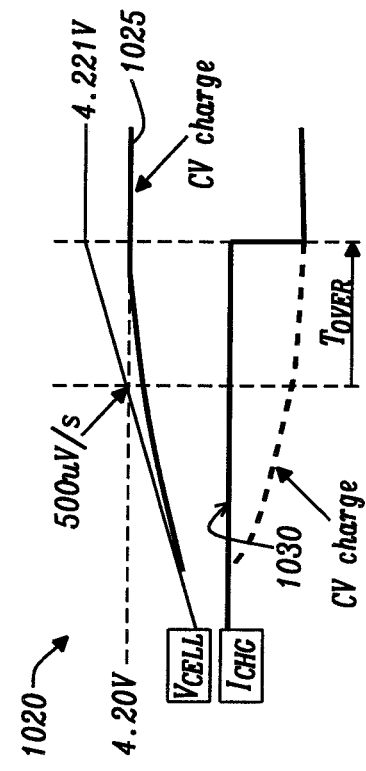

The present disclosure uses two techniques to achieve the constant current control loop of the battery charger, a Digital Voltage Limiter, illustrated in FIGS. 8A, 8B, and 8C, and an Accelerated Settle Down method, illustrated in FIG. 9A and 9B.

FIG. 8B shows the Digital Voltage Limiter (DVL) 820 of the disclosure replacing the constant voltage (CV) control loop 810, as shown in FIG. 8A, of the prior art. FIG. 8C includes voltage and current curves for the disclosed battery charger. $D_{CC}$ is the dynamic digital control for the constant current (CC) in 830, from which the value of $I_{CHG}$ 860 depends. As a result of the DVL charging, $I_{CHG}$ is dynamically changed, which differs from the CV logic of the prior art. $D_{CV}$ is a digital signal used for controlling a feedback gain setting, and is a fixed value. $D_{CV}$ detects a peak voltage, e.g. 4.2V, and when the peak voltage is detected by the DVL, changes $D_{CC}$ to change the charging current. If the system changes $D_{CV}$ in the CC region, it has the effect of $V_{BAT}$ 840 acting as a voltage monitor. For the specific $D_{CV}$, a High or Low signal is output from the comparator. By sweeping $D_{CV}$, the voltage $V_{BAT}$ is evident. After sweeping $D_{CV}$ from the lower voltage, $D_{CV}$ reaches 4.2 V. For the selling of $D_{CV}$=4.2 V, the sequence described above is performed. The comparator used is a standard comparator.

The digital control circuit calculates $D_{CC}$ according to $V_{BAT}$ in the DVL region. $D_{CV}$ is a digital control signal for a particular feedback gain, and $\{V_{BAT}\}\times\{$feedback gain $(D_{CV})\}=\{$the reference voltage$\}$ may be input to the DVL comparator. The sensed $V_{BAT}$ is digitized by the DVL, and also input to the comparator. The comparator in FIG. 8B gives 1-bit output data, and for a specific value of $D_{CV}$, there is a 1-bit comparator output. By seeing a $D_{CV}$ value that changes the comparator output from Low to High, the digitized version of $V_{BAT}$ is achieved. The comparator output $DVL_{OUT}$ is fed to the dynamic controls, for gate control of the power and mirror devices in FIG. 13. This then determines the required $D_{CC}$ from $D_{CV}$, to trace the CC-DVL charging profile.

Similar to a Zener diode voltage clamp, the Digital Voltage Limiter is clamped to a set $V_{BAT}$ state. The DVL doesn't require loop stability, or a special topology for its comparator. Any topology is permitted, as long as the input offset is small, which is managed by trimming, or an auto zero function, for example.

Figure 7A:
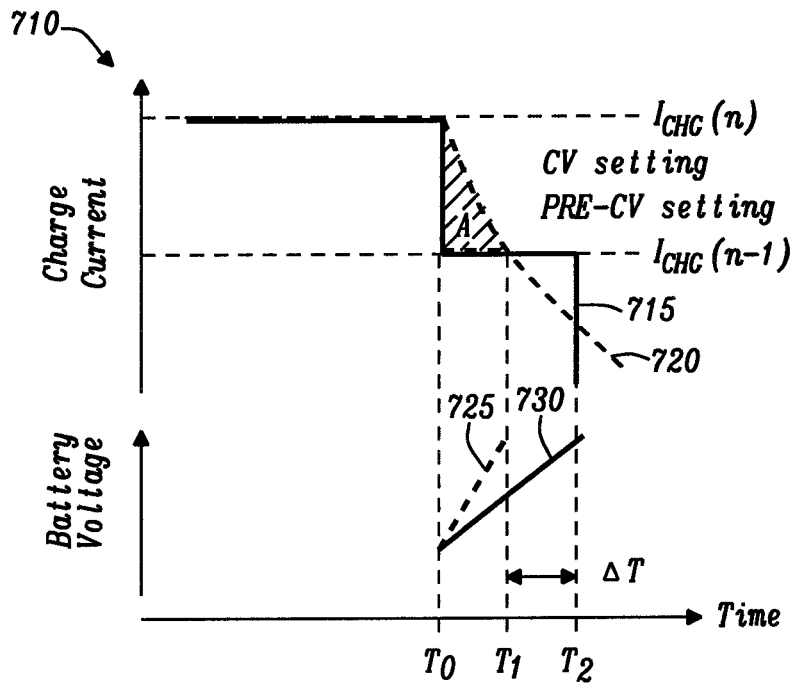
FIGS. 7A and 7B are current/voltage diagrams showing that during CC step down, the battery charger digitally changes the CC setting to be smaller than the charge termination current, and introduces another disadvantage.
Figure 7B:
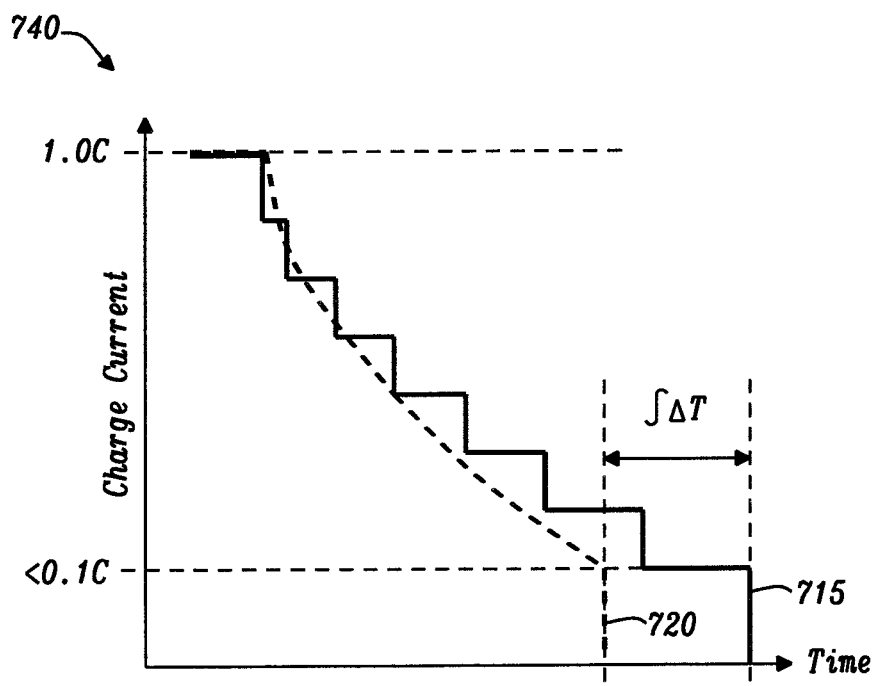

FIGS. 9A and 9B illustrate an Accelerated Settle Down (ASD) technique to achieve the constant current control loop for the charger. ASD 910 is used during DVL calculation of $D_{CC}$ charging in 950, and has a faster charging time associated with current $I_{CHG}$ 960 than a constant voltage control loop of prior art. By increasing and decreasing the charging current periodically as shown in FIGS. 9A and 9B, the average charge current is larger than the current controlled by the scheme shown in FIG. 7A, leading to a shorter charging time. The variable alpha controls the average charging current, and a higher alpha is always preferred. A smaller delta T is needed for a shorter charging time. Therefore, by having delta T'<delta T, the present disclosure can achieve a smaller charging time. Note that $V_{CELL}$ is the voltage across the battery cell in FIG. 13.

Figure 10A:
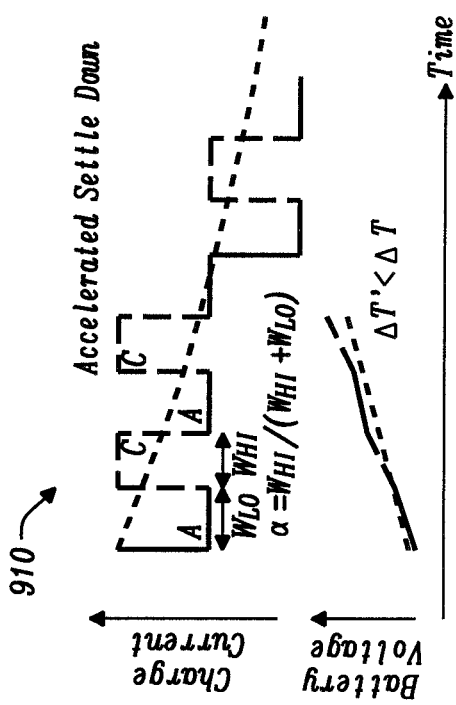
FIGS. 10A and 10B include voltage curves showing how the digitalized step down of the charging current in both FIGS. 6 and 9 takes into account over-charging.
Figure 10B:
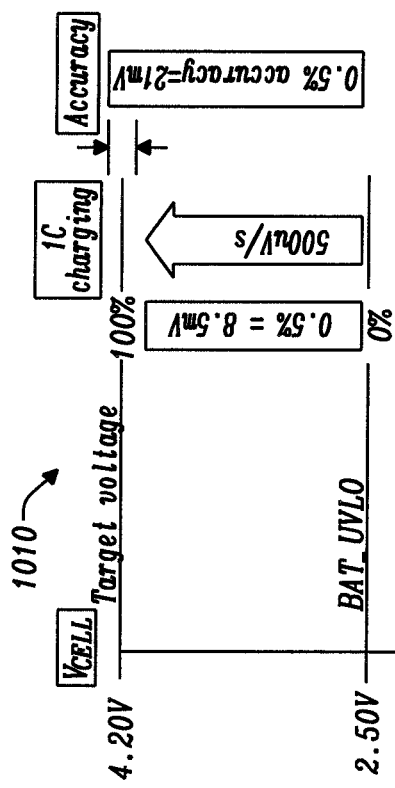

FIGS. 10A and 10B include voltage curves showing how the digitalized step down of the charging current $I_{CHG}$ (620, 960) in FIGS. 6 and 9B takes into account over-charging. For example, the calculation of $I_{CHG}$ 1030, in 1020, is for $V_{CELL}$ 1025>4.20V+0.5% in 1010. The system continues charging if the digital control is too slow to stop charging, for example when $R_{ESR}\approx0$.

$$T_{OVER} = \frac{4.221\ V - 4.200\ V}{\frac{500\ uV}{s}} = 42[sec] \qquad (6)$$

$T_{OVER}$ is over charge time, allowed before charging is stopped, as to not damage the battery. Equation (6) is $T_{OVER}$ of the prior art.

For example, if there are 10 steps controlled by a 1 ms clock, the time is still smaller than $T_{OVER}$.

$$10\ steps \times 1\ msec = 10\ [msec] \ll T_{OVER} = 42\ [sec] \qquad (7)$$

In equation (7), 10 msec is arbitrarily chosen. For the present disclosure, any number of steps and clock frequency can be chosen, as long as (steps)*(1/(clock freq.))<42 [sec]. What's important is there is much more controllability for the number of steps and clock frequency chosen, than in the prior art, leading to a simpler design.

The Digital Voltage Limiter and the Accelerated Settle Down techniques used in the constant current control of the battery charger of the disclosure resolve the disadvantages of the CC step down and CV control loop of the prior art. Additional advantages include an alternative to comparators for $V_{BAT}$ threshold monitoring. For example, a charger IC at the system level needs to monitor $V_{BAT}$ for functions with threshold voltages. In the prior art, one comparator is required for each threshold voltage. In the present disclosure, the digital voltage limiter logic replaces the comparators needed for the above functions. These functions involve short circuit detection, pre-charge voltage detection, and re-charge voltage detection.

The battery charger of the disclosure, with only a constant current (CC) control loop, and the Digital Voltage Limiter (DVL) and Accelerated Settle Down (ASD) logic, has an improved system-level robustness to equivalent series resistance (ESR) variations. This is beneficial when the ESR of a large or small capacity battery or an aged battery tends to be larger. In the conventional architecture, the stability of the constant voltage (CV) control loop feedback relies on the ESR value, and much design effort needs to be taken to make the design insensitive to the variation of ESR. Since the proposed architecture does not have voltage feedback control, there are less stability problems caused by ESR variation. The system can be robust over the change in ESR due to battery aging and can extend battery life.

Background calibration of the CC control loop with DVL and ASD can be used to mitigate error in charge current and the error caused by ESR variation. The use of the disclosed function makes the current regulation more accurate and precise to prevent over-current that may cause damage to the battery.

The present disclosure offers versatile $V_{BAT}$ monitoring by the DVL logic, and can be used elsewhere as a way of battery status monitoring such as a fuel gauge. In addition, the charging profile can be customized with programmable digital gain control, and a charge profile configured based on the system status such as $V_{BAT}$ or battery temperature. For example, if soft start is required, charge current can be increased gradually with time. The same function may be realized in conventional architecture, but flexibility is very limited due to the nature of the analog circuit. In the proposed architecture the change required is only in digital gain control where less effort required.

Figure 11:
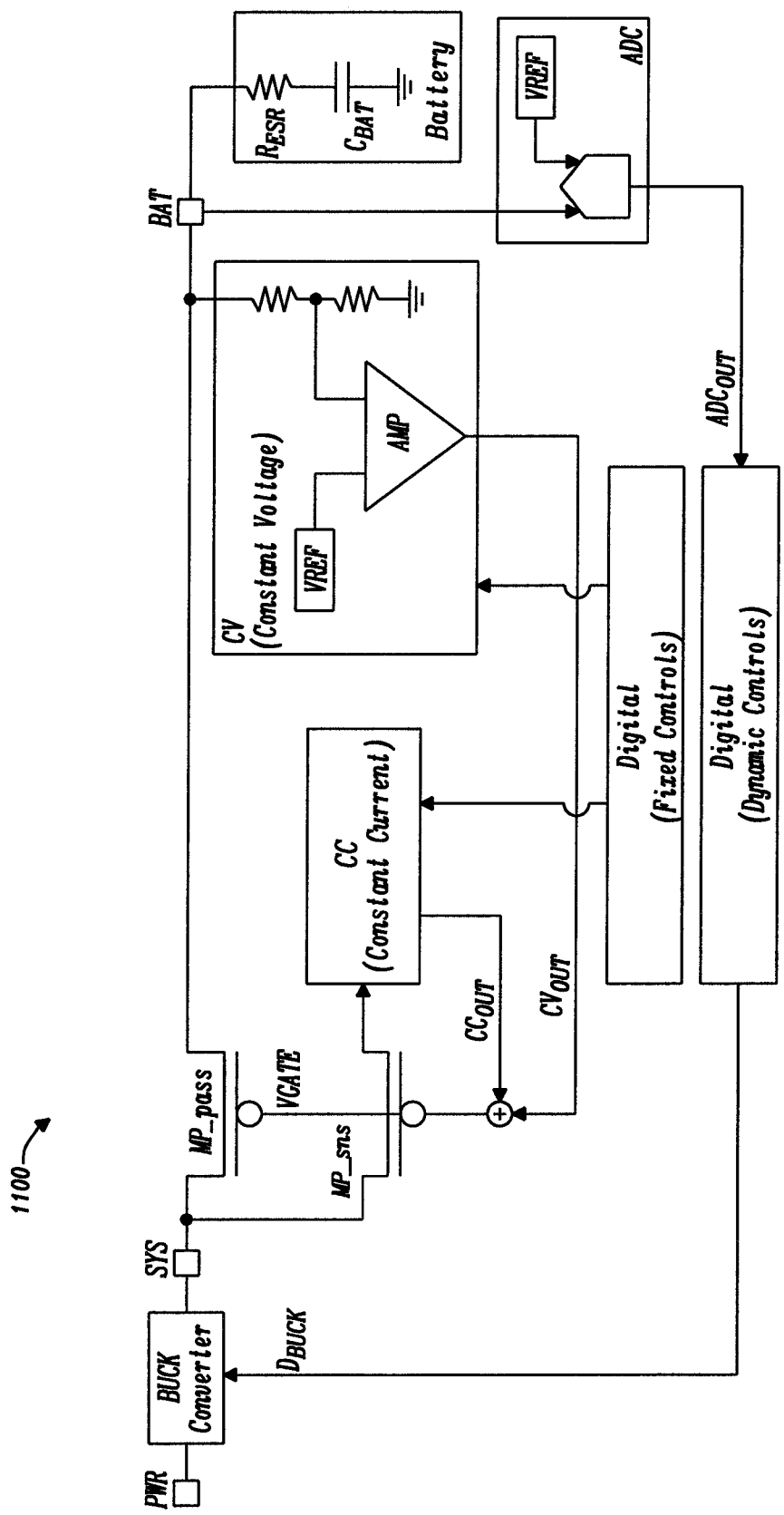
FIG. 11 illustrates where the switching charger may require both a Buck converter and analog to digital control (ADC), in the prior art.

FIG. 11, 1100, illustrates where the battery charger may require both a Buck switch converter and analog to digital control (ADC) logic to monitor $V_{BAT}$, in the prior art.

Figure 12:
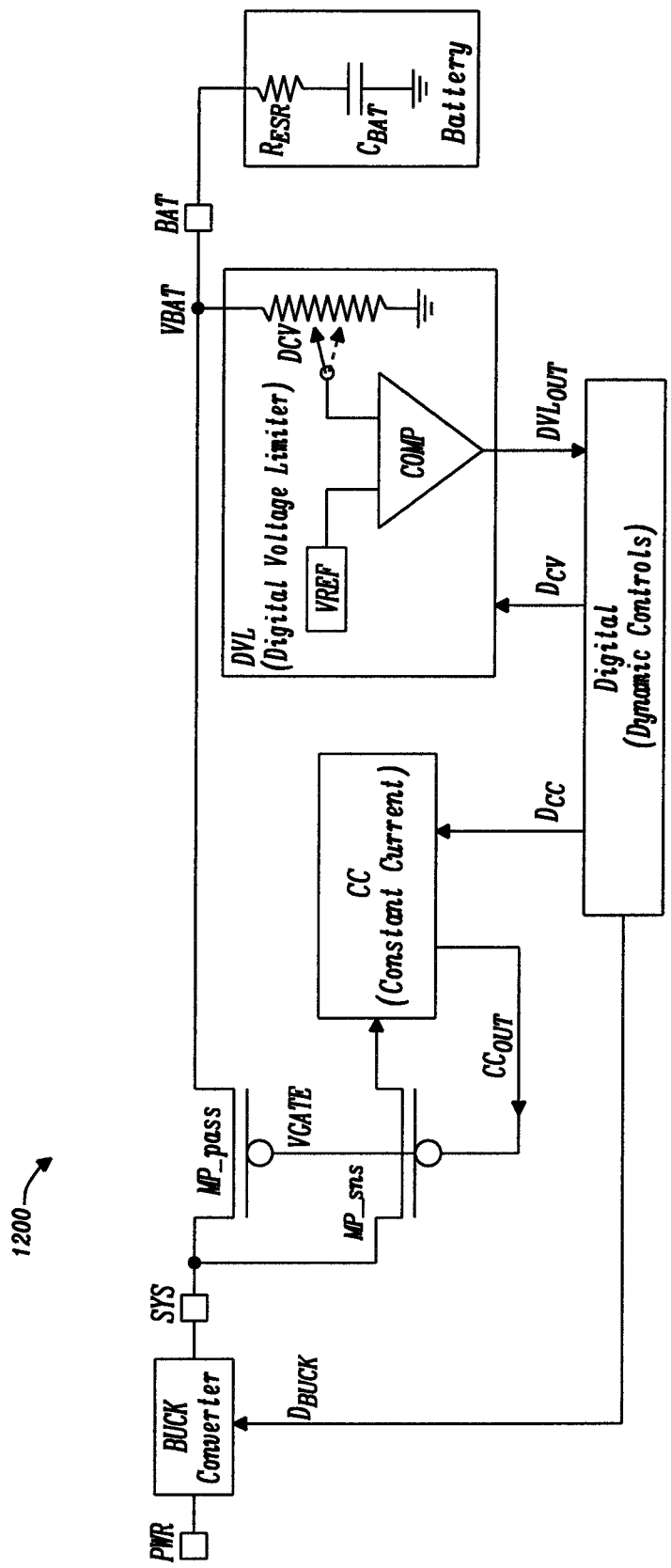
FIG. 12 shows where the proposed architecture of the disclosure only requires a Buck converter, and no ADC, in a switching charger.

FIG. 12, 1200, shows where the proposed architecture of the disclosure only requires a Buck switching converter, and no ADC, in the battery charger. Here, $D_{CV}$ dynamically controls the $V_{BAT}$ voltage in the DVL logic, and the comparators needed are replaced by the Digital Voltage Limiter logic for all functions required. This results in easier design with minimal increase in area.

Figure 1:
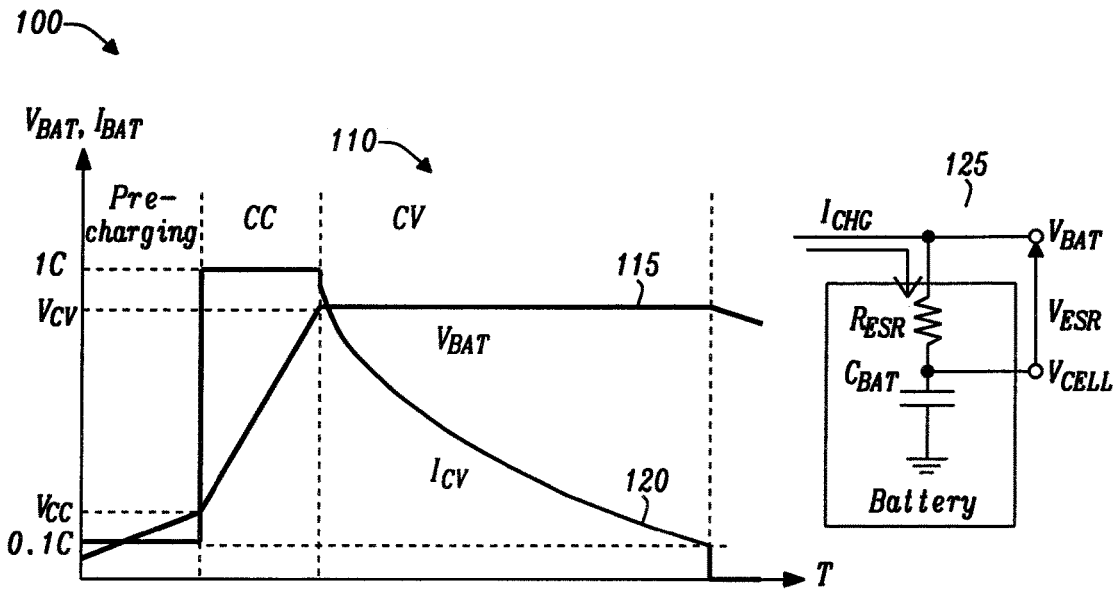
FIG. 1 shows when the voltage of a battery pack is below a threshold voltage to enter constant voltage (CV) from constant current (CC), the charger regulates the charging current.
Figure 2:
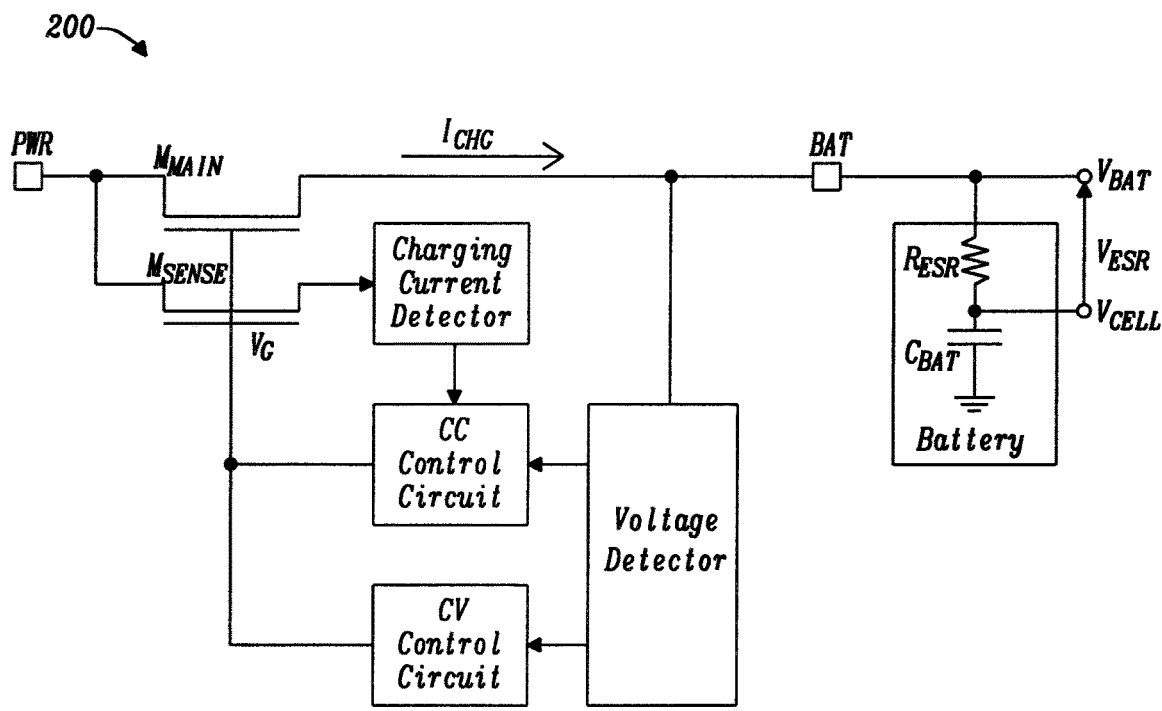
FIG. 2 shows a CC-CV battery charger, where the charger has CC and CV control circuits, functioning apart from each other.
Figure 3A:
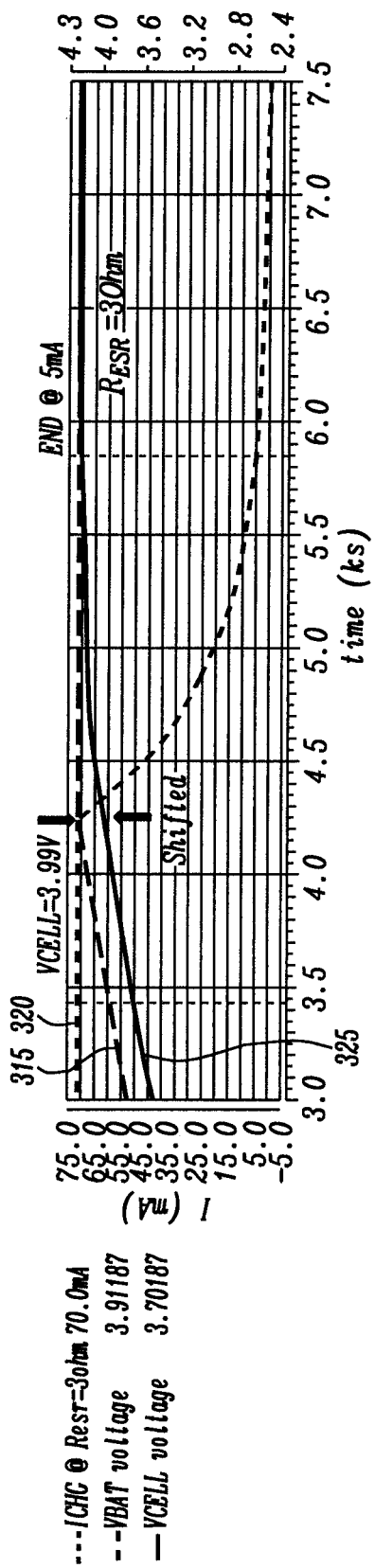
FIGS. 3A (3 ohm) and 3B (6 ohm) are graphical representations showing a larger equivalent series resistance of a battery increases the CV region, and the resulting charge time, as the voltage of the battery is shifted.
Figure 3B:
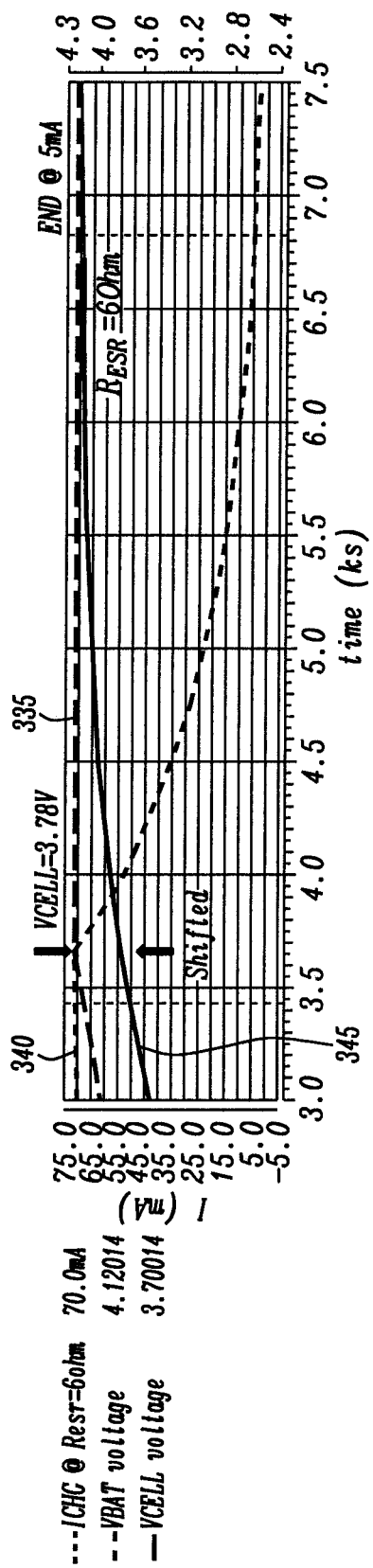
Figure 5:
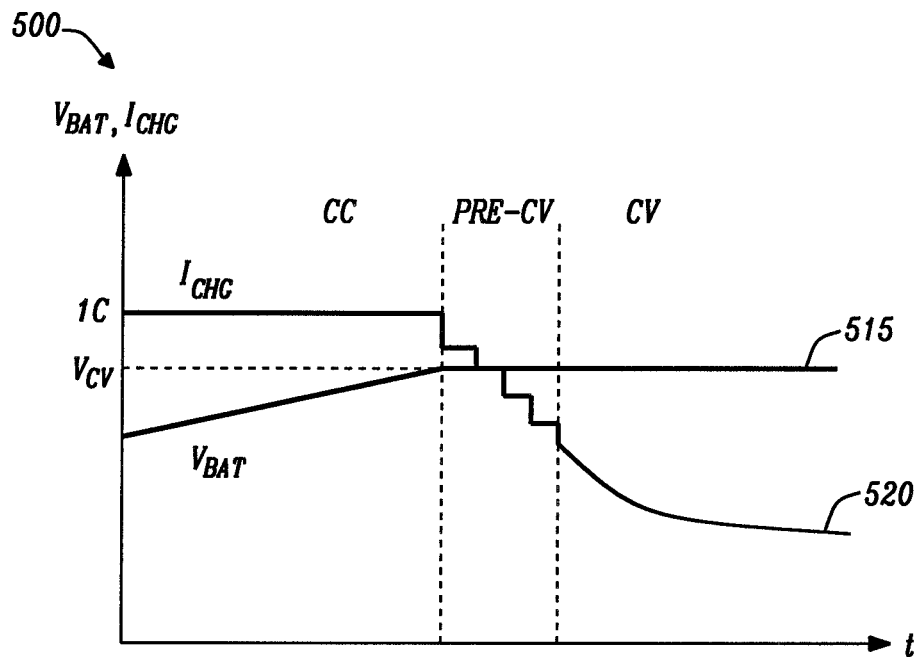
FIG. 5 illustrates another charging profile that uses the CC-CV structure of FIG. 2.
Figure 13:
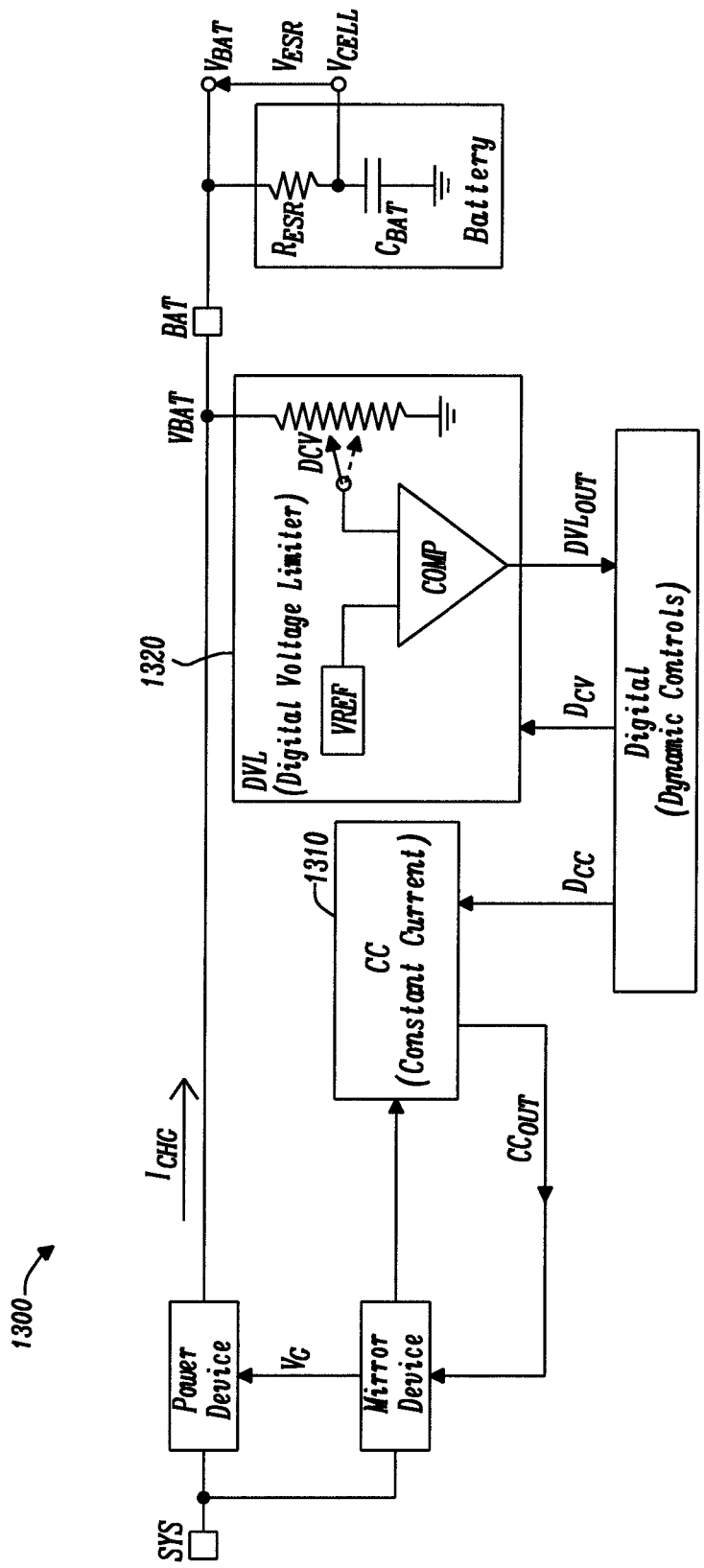
FIG. 13 includes the circuitry of the proposed Digital Voltage Limiter (DVL), in a battery charger of the present disclosure.

FIG. 13, 1300, includes the circuitry of the proposed Digital Voltage Limiter (DVL), in a battery charger of the present disclosure. For constant current (CC) charging, the sense device loop consists of a charge current controller 1310 for always controlling $I_{CHG}$. In the proposed architecture, $I_{CHG}$ is controlled by one control loop, unlike the conventional architecture of FIG. 2, where two control loops exist, i.e. both CC and CV controls. As a result, the possibility of $I_{CHG}$ discontinuity between CC and CV charging is removed. And during charging, CC setting $D_{CC}$ is updated according to the battery voltage $V_{BAT}$ sensed and digitized by the DVL logic in 1320, of the present disclosure.

During CC charging, $I_{CHG}$ is constant, for example at a 0.1 C charging rate for pre-charging, or a 1 C charging rate for fast-charging:

$$I_{CHG}(t) = KD_{CC}(n) \quad (8)$$

where K is the constant value to calculate the charging current from the digital code, and $D_{CC}(n)$ is the on register map value.

During DVL charging, once the DVL logic detects the limit of $V_{BAT}$, the system counts $DVL_{OUT}(=1'b1)$ to arrive to $N_{DET}$. ($\int DVL_{OUT} = N_{DET}$), where 1'b1 and 1'b0 are logic-1 and logic-0 binary numbers, respectively, and $N_{DET}$ is the total number of "1"s appearing on $DVL_{OUT}$, in a specific period of time.

The charging current of (8) becomes (9) in the next step:

$$I_{CHG}(t_1) = KD_{CC}(n-1) \quad (9)$$

If $DVL_{OUT}$ keeps 1'b1, the charging current can go to (10) in the next step:

$$I_{CHG}(t_2) = KD_{CC}(n-2) \quad (10)$$

If $DVL_{OUT}$ changes 1'b0, then it goes back to (9) and resets $\int DVL_{OUT}$. So, the logic needs to wait for $\int DVL_{OUT} = N_{DET}$ again to be (10). When the charging current $I_{CHG}$ is reduced below the termination current rate (e.g. 0.1 C), charging is terminated.

Figure 14B:
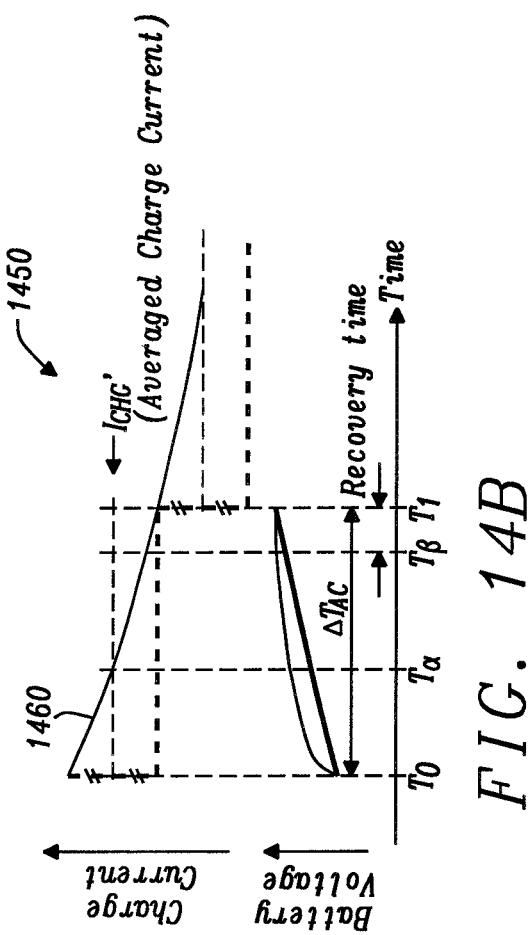
FIGS. 14A and 14B include voltage/circuit curves demonstrating how the charge time of the Accelerated Settle Down is calculated.
Figure 14A:
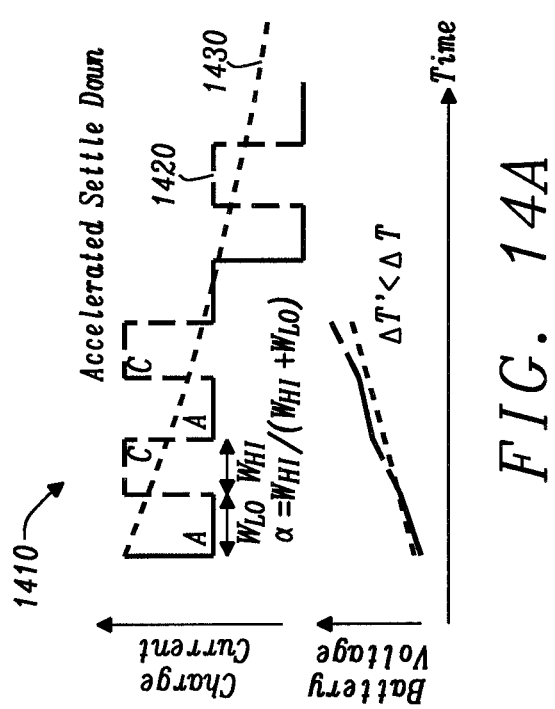

FIGS. 14A and 14B include voltage/circuit curves demonstrating how the charge time of the Accelerated Settle Down is calculated by $I_{CHG}'$ 1460 in 1450. $W_{LO}$ is fixed to 1, and $N_{DET}$ changes $W_{HI}$. Note that $N_{DET}=1$ means $\alpha=0.5$ in FIGS. 14A and 14B, where the ASD duty cycle is $\alpha=W_{HI}/(W_{HI}+W_{LO})$, where a higher alpha is always preferred. The Accelerated Settle Down logic uses the pulse control via $D_{CC}$ to generate $I_{CHG}'$ and:

$$I_{CHG}(n-1) < I_{CHG}' < I_{CHG}(n) \quad (11)$$

This means, the system is waiting for $R_{ESR} \times I_{CHG}(n-1) = V_{BAT}$ with charging $I_{CHG}'[>I_{CHG}(n-1)]$, so, that it can have the recovery time $(T_\beta - T_1)$. The recovery time can then secure the charge time increasing, and finally it can be faster than CV settling time for a deeper charging requirement.

According to (4), prior art CV charging is given by:

$$\Delta T_{CV} = T_1 - T_0 = \tau(k_1 - k_0) \quad (12)$$

The charge time of the Accelerated Settle Down of the disclosure is calculated by $I_{CHG}'$:

$$I'_{CHG} = \alpha \cdot \{I_{CHG}(n) - I_{CHG}(n-1)\} + I_{CHG}(n-1) \quad (13)$$

$$(0 < \alpha < 1)$$

$$\Delta T_{AC} = T_1 - T_0 = \frac{C_{BAT}}{I'_{CHG}} dV = \tau \cdot \frac{e^{k_1 - k_0} - 1}{\alpha \cdot e^{k_1 - k_0} + 1 - \alpha} \quad (14)$$

$$\frac{\Delta T_{AC}}{\Delta T_{CV}} = \frac{1}{(k_1 - k_0)} \cdot \frac{e^{k_1 - k_0} - 1}{\alpha \cdot e^{k_1 - k_0} + 1 - \alpha} \quad (15)$$

$$(k_1 - k_0 > 0)$$

The initial state of the settle down is not so different (1420 in 1410):

$$\frac{\Delta T_{AC}}{\Delta T_{CV}} \approx \frac{1}{\alpha \cdot (k_1 - k_0) + 1} \approx 1 \quad (16)$$

$$(0 < k_1 - k_0 \ll 1)$$

The deeper state of the settle down will be about 33% reduced (1430 in 1410), comparing delta Tac for the disclosure to delta Tcv of the prior art CV approach:

$$\frac{\Delta T_{AC}}{\Delta T_{CV}} \approx 0.67 \quad (17)$$

$$(k_1 - k_0 = 1, \alpha = 0.9)$$

For example:
$C_{BAT}=210F$, $R_{ESR}=3$ ohm, CV charging is from 10 mA to 5 mA:

$$\Delta T_{CV} = T_1 - T_0 = \tau(k_1 - k_0) = 436.7 \text{ [sec]} = 0.5:$$

$$\Delta T_{AC} = T_1 - T_0 = \frac{C_{BAT}}{I'_{CHG}} dV = 420.0 \text{ [sec]} < \Delta T_{CV} = 0.9:$$

$$\Delta T_{AC} = T_1 - T_0 = \frac{C_{BAT}}{I'_{CHG}} dV = 331.6 \text{[sec]} < \Delta T_{CV}$$

Figure 15:
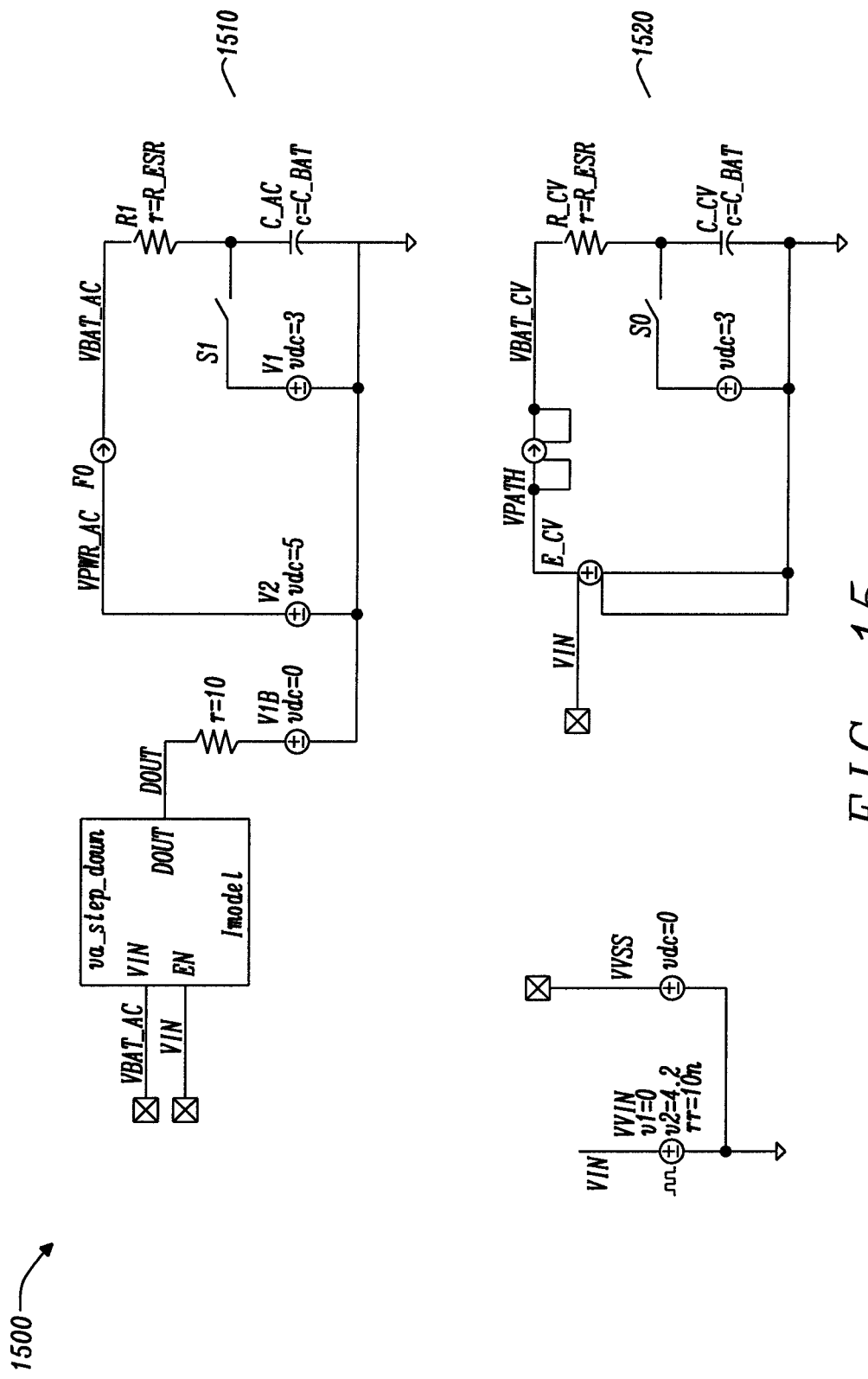
FIG. 15 illustrates a test bench circuit, which includes both the CC-CV control logic of the prior art, and the CC-DVL control logic of the present disclosure.

FIG. 15, 1500, illustrates a test bench circuit, which includes both the CC-CV control logic 1520 of the prior art, and the CC-DVL control logic 1510 of the present disclosure. The test bench circuits of FIG. 15 are used to generate the waveform results of FIGS. 16A and 16B, and the simulation results of FIGS. 17A and 17B, for the voltage of the battery pack $V_{BAT}$, the voltage of the battery cell $W_{ELL}$ across $R_{ESR}$, and the charging current $I_{CHG}$.

Figure 16A:
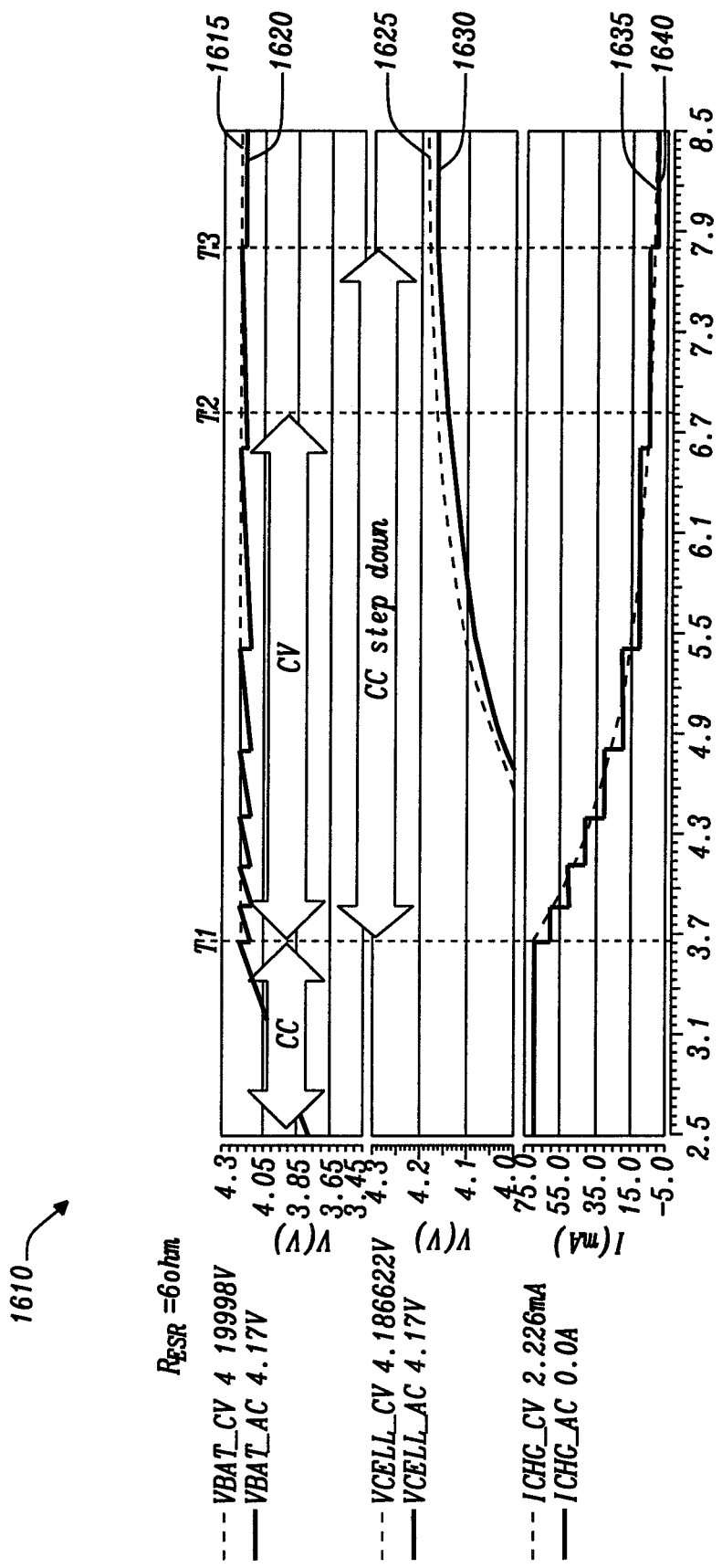
FIGS. 16A and 16B show waveform results for CC-CV control logic compared with CC-CC step down logic, and CC-CV control logic compared with CC-Accelerated Settle Down (ASD) logic.
Figure 16B:
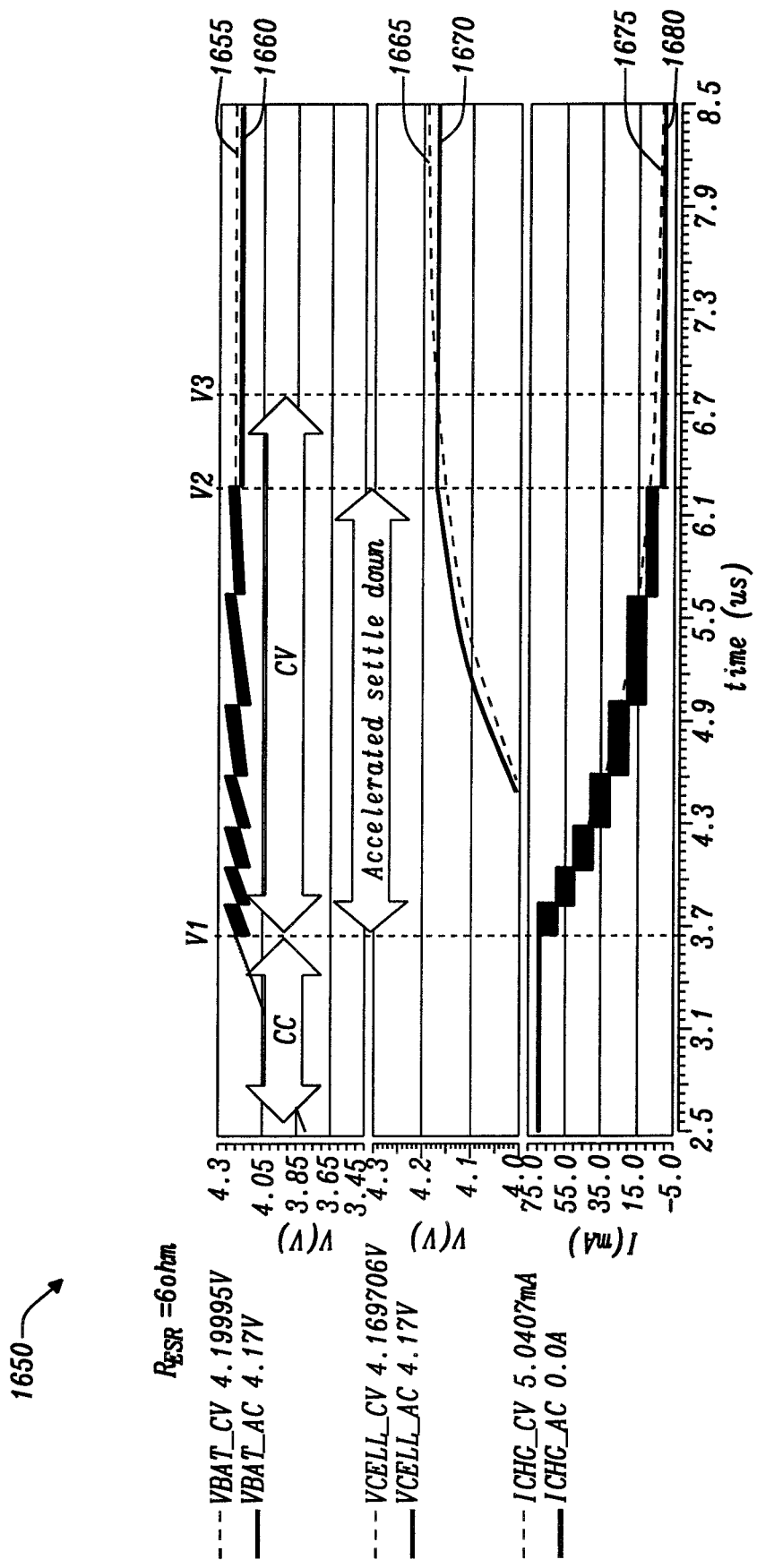

FIGS. 16A and 16B show waveform results for CC-CV control logic compared with CC-CC step down logic both in the prior art, in 1610, and CC-CV control logic compared with CC-Accelerated Settle Down (ASD) logic of the disclosure, in 1650. Signals 1615, 1625, and 1635 represent CC-CV signals $V_{BAT}$, $V_{CELL}$, and $I_{CHG}$ respectively, and signals 1620, 1630, and 1640 represent CC-CC step down signals $V_{BAT}$, $V_{CELL}$, and $I_{CHG}$, respectively, in 1610. Signals 1655, 1665, and 1675 represent CC-CV signals $V_{BAT}$, $V_{CELL}$, and $I_{CHG}$ respectively, and signals 1660, 1670, and 1680 represent CC-ASD signals $V_{BAT}$, $V_{CELL}$, and $I_{CHG}$, respectively, in 1650.

FIGS. 17A and 17B illustrate simulation results for the architecture of the prior art CC-CV logic, compared to that of the present disclosure CC-DVL logic, when the equivalent series resistance varies from 3 ohms in 1710, to 6 ohms in 1750. When the ESR is 3 ohms, the charge time for the disclosed constant current-digital voltage limiter (CC-DVL) logic is 283 seconds less than the constant current-constant voltage (CC-CV) logic. When the ESR is 6 ohms, the charge time for the disclosed CC-DVL logic is 564 seconds less than the CC-CV logic.

Figure 18:
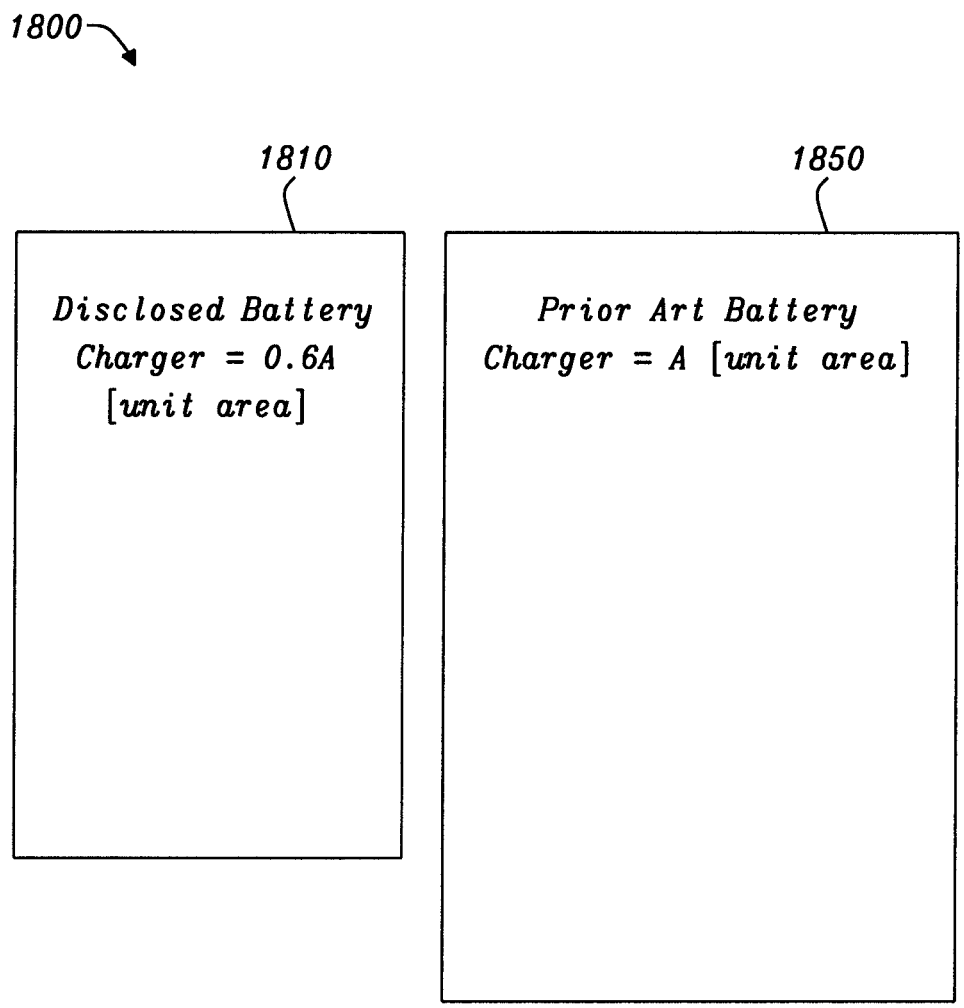
FIG. 18 shows how the circuit area used for the small size solution provided by the present disclosure compares to the area used for the circuit layout for a similar battery charger of the prior art.

FIG. 18, 1800, shows how the circuit area used for the small size solution provided by the present disclosure compares to the area used for the circuit layout for a similar battery charger of the prior art. The disclosed battery charger in 1810 achieves a 38% smaller solution than the prior art battery charger in 1850. In this example, where the two projects are comparable with about the same target specification for the battery charger, the disclosed battery charger uses an area of 1.0 mm^2, whereas the prior art charger uses 1.61 mm^2.

Figure 19:
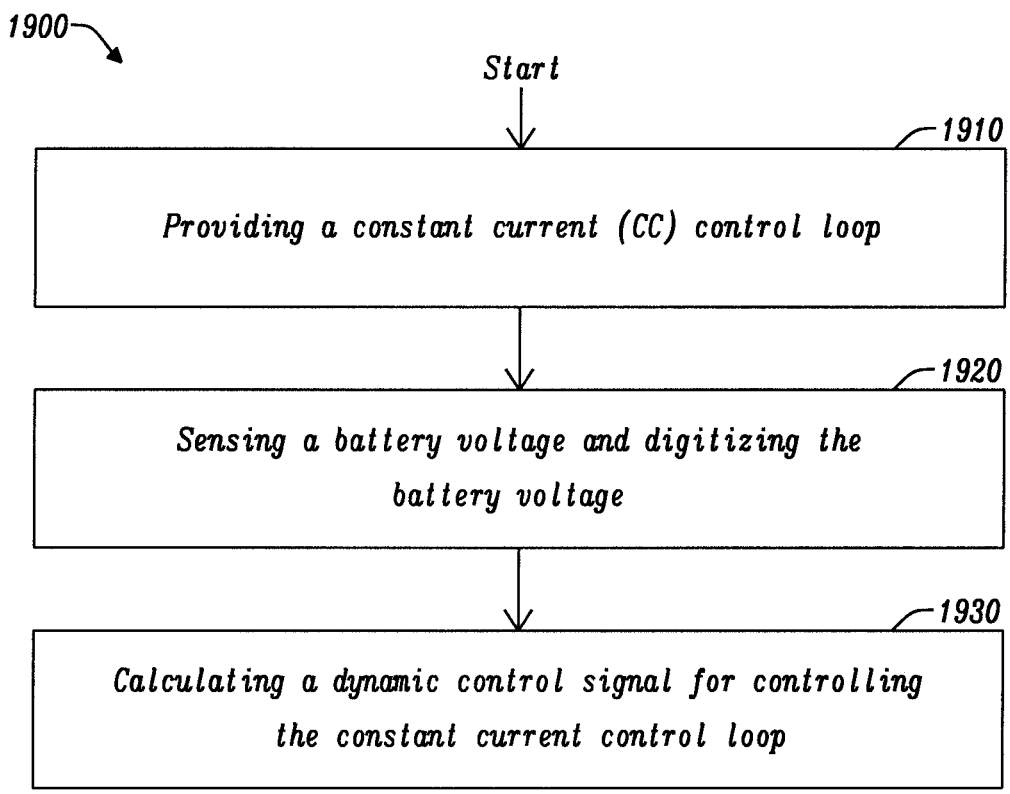
FIG. 19 is a flow chart of a method for constant current control, in a battery charger.

FIG. 19, 1900, is a flow chart of a method for constant current control, in a battery charger. The steps include 1910, providing a battery charger with a constant current (CC) control loop. The steps also include 1920, sensing a battery voltage and digitizing the battery voltage. The steps also include 1930, calculating a dynamic control signal for controlling a charge current.

The main advantage of one or more embodiments of the present disclosure include replacing comparator logic with digital voltage limiter logic, resulting in easier design with minimal increase in area. In addition, the disclosed battery charger has an improved system-level robustness to equivalent series resistance variations. The use of the disclosed function makes the current regulation more accurate and precise to prevent over-current that may cause damage to the battery. Also, the charging profile can be customized with programmable digital gain control and a charge profile configured based on the system status, such as battery voltage or temperature.

While particular embodiments of the present disclosure have been illustrated and described, it will be understood by those skilled in the art that various changes in form and details may be made without departing from the spirit and scope of the invention.

The invention claimed is:

1. A battery charger comprising:
a constant current control loop, configured to control a charge current provided to charge a battery;
a digital voltage limiter, configured to sense and digitize a battery voltage, to drive a digital controller; and
said digital controller, configured to calculate a dynamic control signal for controlling the constant current control loop;
wherein the battery charger is configured to use only the constant current control loop for an entire charging cycle without need for a constant voltage control loop, and
wherein the constant current control loop is configured to control the charge current both before and after a desired peak charging voltage is achieved.

2. The battery charger of claim 1, wherein the battery charger is configured to utilize an accelerated settle down (ASD) after a constant current charging period is complete, having a duty cycle of a=$W_{HI}$ I ($W_{HI}$+$W_{LO}$), where $W_{LO}$ is a low time of an ASD period for said charge current and is fixed to 1, and $W_{HI}$ is a high time of said ASD period for said charge current and is variable.

3. The battery charger of claim 1, further comprising a power device and a mirror device, controlled by a shared gate voltage.

4. The battery charger of claim 3, wherein the constant current control loop is configured to provide the shared gate voltage.

5. The battery charger of claim 1, wherein the digital voltage limiter comprises a comparator, configured to compare the digitized battery voltage to a reference voltage.

6. The battery charger of claim 5, wherein the digital controller is configured to receive an output of the comparator.

7. The battery charger of claim 1, wherein the digital controller is configured to provide a fixed control voltage to the digital voltage limiter.

8. The battery charger of claim 7, wherein the fixed control voltage is configured for a programmable digitized gain on the reference voltage.

9. The battery charger of claim 1, wherein the constant current control loop is configured to receive the dynamic control signal.

10. The battery charger of claim 1, wherein the constant current control loop is configured to set the charge current to a constant value during pre-charging or fast- charging.

11. The battery charger of claim 1, wherein the constant current control loop is configured to step down the charge current below a termination current.

12. The battery charger of claim 1, configured to monitor the battery voltage for short circuit detection, pre-charge voltage detection, or re-charge voltage detection.

13. The battery charger of claim 1, further comprising a Buck switching converter configured to provide said charge current and which is controlled by said digital controller.

14. A method for constant current control in a battery charger, comprising the steps of:
providing a constant current (CC) control loop;
sensing a battery voltage and digitizing the battery voltage, with a digital voltage limiter, to drive a digital controller; and
calculating a dynamic control signal for controlling the constant current control loop,
wherein the battery charger uses only the constant current control loop for an entire charging cycle without need for a constant voltage control loop, and
wherein the constant current control loop controls the charge current both before and after a desired peak charging voltage is achieved.

15. The method of claim 14, wherein the constant current control loop decreases a charge current below a termination current.

16. The method of claim 14, wherein the battery charger utilizes an accelerated settle down (ASD) after a constant current charging period is complete, having a duty cycle of a=$W_{HI}$ ($W_{HI}$+$W_{LO}$) where $W_{LO}$ is a low time of an ASD period for said charge current and is fixed to 1, and $W_{HI}$ is a high time of said ASD period for said charge current and is variable.

17. The method of claim 14, wherein a shared gate voltage controls a power device and a mirror device.

18. The method of claim 17, wherein the constant current control loop provides the shared gate voltage.

19. The method of claim 14, wherein a comparator of the digital voltage limiter compares the digitized battery voltage to a reference voltage.

20. The method of claim 19, wherein a digital controller receives an output of the comparator.

21. The method of claim 20, wherein a digital controller provides a fixed control voltage to the digital voltage limiter.

22. The method of claim 21, wherein the fixed control voltage provides a programmable digitized gain on the reference voltage.

23. The method of claim 14, wherein the constant current control loop receives the dynamic control signal.

24. The method of claim 14, wherein the constant current control loop sets the charge current to a constant value during pre-charging or fast-charging.

25. The method of claim 14, wherein the constant current control loop steps down the charge current below a termination current at an end of a charging cycle.

26. The method of claim 14, further comprising a Buck switching converter providing to generate the charge current and which is controlled by the digital controller.

* * * * *